(12) United States Patent
Hattendorf et al.

(10) Patent No.: US 9,768,249 B2
(45) Date of Patent: Sep. 19, 2017

(54) TRIGATE TRANSISTOR STRUCTURE WITH UNRECESSED FIELD INSULATOR AND THINNER ELECTRODES OVER THE FIELD INSULATOR

(71) Applicant: Intel Corporation, Santa Clara, CA (US)

(72) Inventors: Michael L. Hattendorf, Portland, OR (US); Pragyansri Pathi, Portland, OR (US); Michael K. Harper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/778,063

(22) PCT Filed: Jun. 26, 2013

(86) PCT No.: PCT/US2013/047871
§ 371 (c)(1),
(2) Date: Sep. 17, 2015

(87) PCT Pub. No.: WO2014/209297
PCT Pub. Date: Dec. 31, 2014

(65) Prior Publication Data
US 2016/0204193 A1    Jul. 14, 2016

(51) Int. Cl.
*H01L 29/06* (2006.01)
*H01L 29/78* (2006.01)
*H01L 27/11* (2006.01)
*H01L 29/423* (2006.01)
*H01L 29/66* (2006.01)

(52) U.S. Cl.
CPC ...... *H01L 29/0653* (2013.01); *H01L 27/1104* (2013.01); *H01L 29/42376* (2013.01); *H01L 29/66795* (2013.01); *H01L 29/785* (2013.01); *H01L 29/7851* (2013.01)

(58) Field of Classification Search
CPC ............ H01L 27/1104; H01L 29/7851; H01L 29/66795; H01L 29/42376
USPC ........................................ 257/393, 532, 368
See application file for complete search history.

(56) References Cited

U.S. PATENT DOCUMENTS

| | | |
|---|---|---|
| 2006/0205134 A1 | 9/2006 | Nishimura |
| 2007/0075377 A1 | 4/2007 | Huang et al. |
| 2009/0108358 A1* | 4/2009 | Lee ................... H01L 29/66621 257/368 |
| 2011/0057269 A1 | 3/2011 | Filson et al. |
| 2011/0121405 A1 | 5/2011 | Takao |
| 2012/0299083 A1* | 11/2012 | Toratani ............ H01L 21/28282 257/324 |

OTHER PUBLICATIONS

International Preliminary Report on Patentability for International Application No. PCT/US2013/047871, mailed on Jan. 7, 2016, 8 pages.

(Continued)

*Primary Examiner* — Tuan Nguyen
(74) *Attorney, Agent, or Firm* — Green, Howard & Mughal, LLP

(57) ABSTRACT

Techniques related to integrated circuits having MOSFETs with an unrecessed field insulator and thinner electrodes over the field insulator of ICs, systems incorporating such integrated circuits, and methods for forming them are discussed.

18 Claims, 8 Drawing Sheets

(56) References Cited

OTHER PUBLICATIONS

Notice of Allowance for Taiwan Patent Application No. 103119201, issued on Oct. 15, 2015.
International Search Report and Written Opinion of the International Searching Authority for International Application No. PCT/US2013/047871, mailed on Mar. 28, 2014, 11 pages.
English Translation of Office Action for Taiwan Patent Application No. 103119201, issued on Jun. 17, 2015.
Notice of Allowance and Search Report for Taiwan Patent Application No. 104138123 mailed Dec. 20, 2016, 4 pages.
International Preliminary Report on Patentability for International Application No. PCT/US2013/047871 mailed Jan. 7, 2016, 8 pages.
International Search Report and Written Opinion for International Application No. PCT/US2013/047871 mailed Mar. 28, 2014, 11 pages.

* cited by examiner

TRIGATE TRANSISTOR STRUCTURE WITH UNRECESSED FIELD INSULATOR AND THINNER ELECTRODES OVER THE FIELD INSULATOR

CLAIM FOR PRIORITY

The present application claims the benefit of priority of International Patent Application PCT/US13/47871, filed on 26 Jun. 2013, and titled "TRIGATE TRANSISTOR STRUCTURE WITH UNRECESSED FIELD INSULATOR AND THINNER ELECTRODES OVER THE FIELD INSULATOR", the contents of which are hereby incorporated in their entirety for all purposes.

TECHNICAL FIELD

Embodiments of the invention generally relate to integrated circuits (ICs), and more particularly relate to trigate transistor structures with an unrecessed field insulator and thinner electrodes over the field insulator to decrease electrode coupling and to increase operating frequency of the ICs.

BACKGROUND

Typical metal-oxide-semiconductor field-effect transistors (MOSFETs) may include a semiconductor (e.g., silicon), electrodes to contact a source and drain, and an electrode to contact or couple with a gate. In some examples, the contact electrodes and/or the gate electrode may be metal electrodes. Further, transistors may typically be separated from each other by a dielectric material such as a field insulator or field oxide. For example, FIG. 1B illustrates a cross-section of typical transistors in a circuit taken along dashed A-A' line of FIG. 1A, which illustrates a plan view of typical transistors in a microelectronic device 100, such as an integrated circuit. As shown in FIG. 1A, a gate electrode 120, a contact electrode 130, and a contact electrode 142 may contact a fin portion 112 of a semiconductor pillar 110 (please refer to FIG. 1A). Similarly, a contact electrode 144 may contact other semiconductor pillars, as shown. As shown in FIG. 1B, semiconductor pillar 110 may also include a base portion 114 adjacent to fin portion 112. Also as shown in FIG. 1A, one or more vias 150a-150d may couple to gate electrode 120 and/or contact electrodes 130, 142, 144 generally to provide electric coupling between the transistors and higher level electrical interconnects, which are not shown for the sake of clarity.

As shown in FIG. 1B, an oxide layer 160 may be disposed on substrate 105 and adjacent to base portion 114 of semiconductor pillar 110, a nitride layer 170 may be disposed on oxide layer 160 and adjacent to base portion 114 of semiconductor pillar 110, and a field insulator 180 (typically a field oxide) may be disposed on nitride layer 170 and adjacent to base portion 114 of semiconductor pillar 110. Also as shown, regions may be defined such that, for example, device regions 192, 194 may include regions having one or more semiconductor pillars and generally little or no field insulator 180 therein while other regions may be defined as field regions 196 (please refer to FIG. 1B). That is, regions having only a field insulator may be considered field regions and areas having active devices and little or no field insulator may be considered device regions such as, for example, device regions 192, 194.

As shown in FIGS. 1A and 1B, portions of gate electrode 120, contact electrode 130, contact electrode 142, and/or contact electrode 144 may extend over portions of the field insulator and into field regions 196. For example, it may be typical for the electrodes to be physically larger than the silicon used to form an intrinsic transistor including semiconductor pillar 110. Further, as shown in FIG. 1B, the depth of gate electrode 120 in device region 192, $D_X$, may be substantially the same as the depth of gate electrode 120 in the field region, $D_F$. For example, field insulator 180 may be recessed with respect to semiconductor pillar 110 such that the top of field insulator 180 may be substantially below the top of fin portion 112 of semiconductor pillar 110 and substantially aligned with the bottom of fin portion 112. Although shown with respect to gate electrode 120, contact electrodes 130, 140, 142 may include similar structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
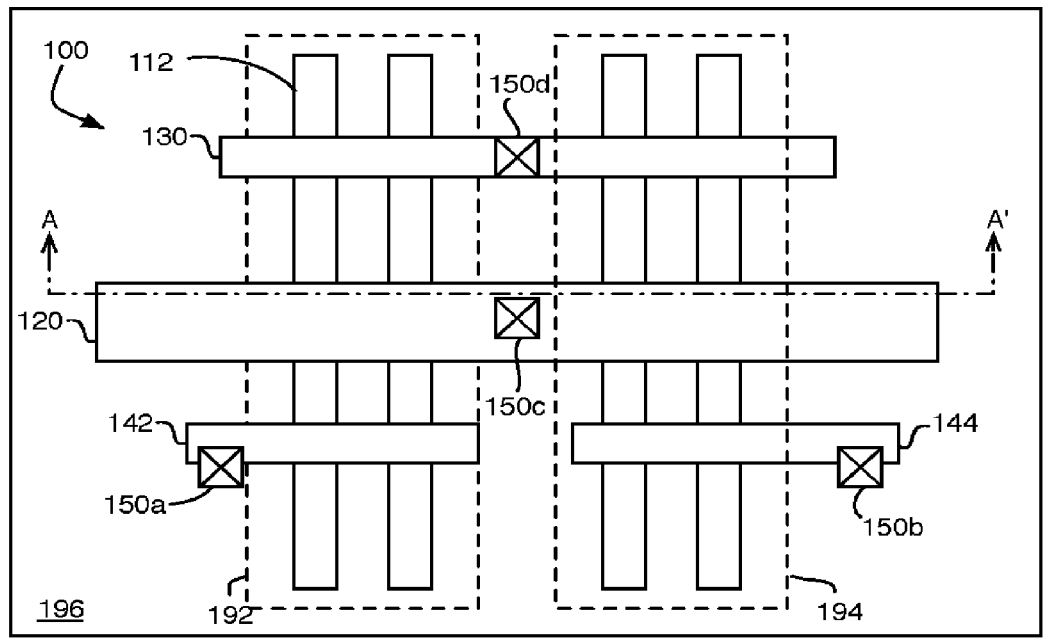
FIG. 1A is a plan view of a prior art layout of transistors.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Devices, microprocessors, apparatuses, computing platforms, and methods are described below related to IC devices having an unrecessed field insulator and thinner electrodes over the field insulator to decrease electrode coupling and to increase operating frequency of the IC devices.

Figure 1B:
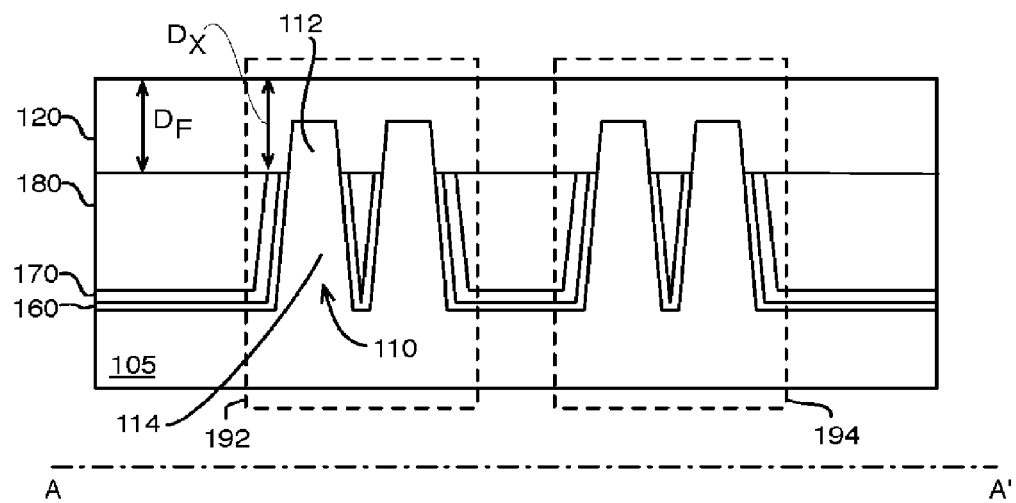
FIG. 1B is a cross-sectional view of prior art transistors.

As described above, capacitance coupling between transistor electrodes such as, for example, between gate electrodes and contact electrodes, or the like, may decrease the maximum operating frequency of an integrated circuit. Referring to FIGS. 1A and 1B, there may be a substantial capacitance coupling between the electrodes such as, for example, between gate electrode 120 and one or more of contact electrodes 130, 142, 144, or the like. Such capacitance may decrease the maximum operating frequency of the integrated circuit and may hinder the performance of microelectronic device 100. Techniques to reduce such capacitance are therefore advantageous and may increase the maximum operating frequency of an integrated circuit and the performance of devices incorporating them. Also as discussed, such electrodes may extend over a field insulator beyond device regions, for example. In general, the described capacitance coupling may include contributions from both the portions of the electrodes in the device region (e.g., regions coupling with or associated with the intrinsic transistor) and portions of the electrodes in the field region (e.g., regions over the field insulator).

As will be described in greater detail below, in various embodiments, a gate electrode and/or a contact electrode may be coupled to a fin portion of a semiconductor pillar and disposed over a field insulator. For example, the electrode may be coupled to the fin portion in a device region and may disposed over the field insulator in a field region of a device. The electrode may have a first depth in the device region and a second depth in the field region such that the second depth is less than the first depth. Such embodiments may provide complete coupling between the electrode and the fin portion of the semiconductor pillar and may provide reduced capacitance coupling between electrodes, which may allow for greater maximum operating frequency of the device. Such a reduced capacitance coupling may be due to the reduced electrode depth over the field region. In various embodiments, the variable depth may be generated by disposing the electrode over an unrecessed field insulator having a portion of the field insulator removed to allow coupling with the fin portion of the semiconductor pillar. In some examples, the top of the (unrecessed) field insulator may be at about the same height as the top of the fin portion of the semiconductor pillar.

As will also be described in greater detail below, in various embodiments, fabricating the electrode having the described variable depths may include forming a conformal insulator layer adjacent to a semiconductor pillar, forming a field insulator adjacent to the conformal insulator, selectively etching the conformal insulator layer formed adjacent to the semiconductor pillar to expose a fin portion of the semiconductor pillar, selectively etching a portion of the field insulator adjacent to the fin portion and leaving an unrecessed field insulator, and forming the electrode coupled to the fin portion and disposed over the unrecessed field insulator. In some examples, the conformal layer may include a nitride, the field insulator may include an oxide, and a second conformal layer including an oxide may be formed over the semiconductor pillar prior to forming the nitride conformal layer. In such examples, the semiconductor pillar may be fully exposed upon the selective oxide etch.

Figure 2:
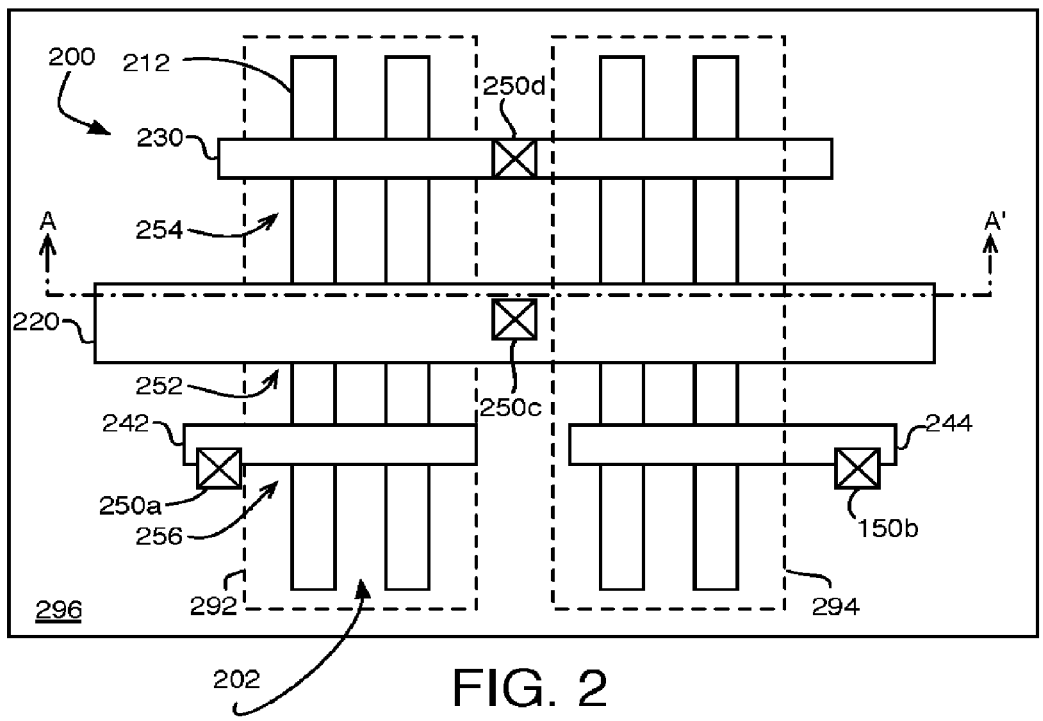
FIG. 2 is a plan view of a layout of example transistors.

FIG. 2 is a plan view of a layout of example transistors, arranged in accordance with at least some implementations of the present disclosure. As shown in FIG. 2, a microelectronic device 200, such as an integrated circuit device or the like, may include a transistor 202 having a gate electrode 220, a contact electrode 230, and a contact electrode 242 contacting a fin portion 212 of a semiconductor pillar or several fin portions of several semiconductor pillars, as shown.

Figure 3:
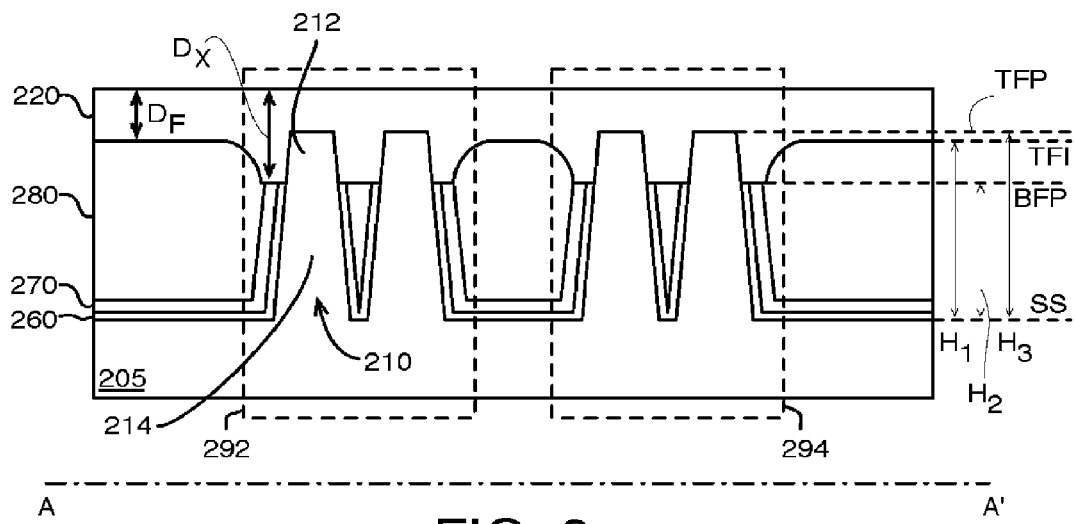
FIG. 3 is a cross-sectional view of example transistors illustrated in FIG. 2 illustrating an unrecessed field insulator and thinner electrodes over the field insulator.

Additional details regarding microelectronic device 200 illustrated in FIG. 2 are shown in FIG. 3, which is a cross-sectional view of example transistors illustrating an unrecessed field insulator and thinner electrodes over the field insulator, arranged in accordance with at least some implementations of the present disclosure. In general, microelectronic device 200 may include any device having a circuit with a logic gate electrode, such as a MOSFET gate electrode (i.e., logic circuitry). For example, microelectronic device 200 may be a microprocessor, a static random access memory (SRAM) circuit, or a portion of an SRAM cache memory of a microprocessor, or the like.

FIG. 3 illustrates a cross-section of microelectronic device 200 taken along dashed A-A' line of FIG. 2. As shown in FIG. 3, a semiconductor pillar 210 may include fin portion 212 adjacent to a base portion 214. In general, fin portion 212 may extend beyond a conformal insulator layer 260 and may be in contact with gate electrode 220, contact electrode 230, and contact electrode 242, and base portion 214 may be adjacent to conformal insulator layer 260. In general, transistor 202 may be any non-planar MOSFET, "finFET", trigate transistor, or the like. Further, as discussed herein, transistor 202 may include semiconductor pillar 210 including base portion 214 and fin portion 212, as described. In other examples, the entirety of semiconductor pillar 210 may be described as a fin and fin portion 212 may be described as a contact portion of the fin, or the like. In some examples, semiconductor pillar 210 may include a silicon on insulator structure such that base portion 214 may be an insulator such as, for example, an oxide. Such structures may be considered a finFET on SOI (silicon on insulator) structure or a fin on insulator structure, or the like.

As shown, semiconductor pillar 210 may be disposed on a substrate 205. In general, substrate 205 may be any suitable substrate such as silicon, silicon on insulator, or the like. In some examples, semiconductor pillar 210 may be contiguous with substrate 205 or a portion of substrate 205. Further, as shown in FIG. 3, conformal insulator layer 260 may be disposed on portions of substrate 205 and adjacent to base portion 214 of semiconductor pillar 210. In some examples, conformal insulator layer 260 may be an oxide. As shown, in general, conformal insulator layer 260 may be adjacent to base portion 214 of semiconductor pillar 210 and fin portion 212 of semiconductor pillar 210 may extend beyond conformal insulator layer 260. Further, a conformal insulator layer 270, may be disposed on conformal insulator layer 260 and adjacent to base portion 214 of semiconductor pillar 210. In some examples, conformal insulator layer 270 may be a nitride. Also as shown, a field insulator 280 may be disposed on conformal insulator layer 270 and adjacent to base portion 214 of semiconductor pillar 210. In some examples, field insulator 280 may be a field oxide. In general, field insulator 280 may provide isolation between transistors and/or semiconductor pillars.

Further, regions may be defined such that, for example, device regions 292, 294 may include regions having one or more transistors or semiconductor pillars and little or no field insulator 280 therein and field regions 296 may include regions outside of device regions 292, 294 and having field insulator 280 therein and other regions may be defined as field regions 196 (please refer to FIG. 1B). That is, regions having only field insulator 280 and no active devices or semiconductor pillars may be considered field regions 296 and areas having active devices and little or no field insulator may be considered device regions such as, for example, device regions 292, 294. As shown, device region 292 may include transistor 202. In general, device regions 292, 294 and field regions 296 may be defined or described relative to substrate 205, such that, for example, device regions 292, 294 may be device regions of substrate 205 and device regions 296 may be device regions of substrate 205.

As shown in FIGS. 2 and 3, portions of gate electrode 220, contact electrode 230, contact electrode 242, and/or contact electrode 244 may extend over portions of the field insulator and into field regions 296. For example, electrodes 220, 230, 242, 244 may be physically larger than the semiconductor pillars (e.g., semiconductor pillar 212) used to form an intrinsic transistor (e.g., transistor 202) and/or electrodes 220, 230, 242, 244 may extend beyond the semiconductor pillars, or the like. As shown in FIG. 3, gate electrode 220 may have a depth, $D_X$, in device region 292 and a depth, $D_F$, in field region 296 (please refer also to FIG. 2) such that depth $D_F$ may be less than depth $D_X$. Such a decrease in depth $D_F$ may reduce capacitance between gate electrode 220 and one or more of contact electrodes 230, 242, 244. For example, thinner electrodes may have the physical and electrical property of reduced capacitance coupling. Further, as will be appreciated, both the device region and field region portions of the electrodes may contribute to capacitance coupling such that thinner electrodes over the field regions as described may substantially reduce capacitance coupling, allowing greater maximum operating frequencies foe microelectronic device 200.

As shown, field insulator 280 may be unrecessed (either fully or partially) with respect to semiconductor pillar 210. For example, field insulator 280 may be fully unrecessed if the top of field insulator 280 (labeled TFI) is at the same level as the top of fin portion 212 (labeled TFP) and field insulator 280 may be partially unrecessed if the top of field insulator 280 (TFI) is between the top of fin portion 212 (TFP) and bottom of fin portion 212 (labeled BFP). As shown, field insulator 280 may have a top surface (TFI) at a height (labeled $H_1$) above a surface of substrate 205 (labeled SS), fin portion 212 may have a top surface (TFP) at a height (labeled $H_3$) above the surface of substrate 205 (SS), and fin portion 212 may have a bottom surface (BFP) at a height (labeled $H_2$) above the surface of substrate 205 (SS). In some examples, height $H_1$ may be substantially equal to height $H_3$, as discussed (i.e., field insulator 280 may be fully unrecessed). In other examples, height $H_1$ may be greater than a midpoint between height $H_2$ and height $H_3$ (i.e., field insulator 280 may be partially unrecessed having a top surface higher than halfway between the bottom and top of fin portion 212). In other examples, height $H_1$ may be greater than a height 30% from the height $H_2$ to height $H_3$ (i.e., field insulator 280 may be partially unrecessed having a top surface higher than 30% between the bottom and top of fin portion 212). In general, field insulator may be unrecessed to any degree to decrease capacitance coupling as described. Further, although the elements of FIGS. 2 and 3 are shown having substantially planar surfaces, straight sidewalls, and the like, real devices may be expected to have some variation.

As discussed, FIGS. 2 and 3 illustrate semiconductor pillar 210 having base portion 214 and fin portion 212 disposed over device region 292 of substrate 205. Field insulator 280 may be disposed over field region 296 of substrate 205 and adjacent to base portion 214 of semiconductor pillar 210. Further, field insulator 280 may be adjacent to fin portion 212 of semiconductor pillar 210 to a certain extent, depending on how much of field insulator 280 is unrecessed relative to fin portion 212, as discussed above. Also as shown, gate electrode 220 may be coupled to fin portion 212 of semiconductor pillar 210 in device region 292 and disposed over field insulator 280 in field region 296. Gate electrode 220 may have a first depth, $D_X$, over device region 292 and a second depth, $D_F$, less than the first depth, $D_X$, over field region 296. Although not shown for the sake of clarity of presentation, transistor 202 may include a gate dielectric disposed between gate electrode 220 and fin portion 212 of semiconductor pillar 210. Further, gate electrode 220 may include a bulk material and a work function material disposed between the bulk material and the gate dielectric.

As discussed, one or more of contact electrodes 230, 242, or 244 may have a similar structure to gate electrode 220. In some examples, contact electrode 230 may be a source contact and contact electrode 242 may be a drain contact. As shown in FIG. 2, contact electrode 230 may contact fin portion 212 of semiconductor pillar 210 in device region 292 and may include a portion disposed over field insulator 280 in field region 296. Contact electrode 230 may have a similar structure to that of gate electrode 220 such that contact electrode 230 may have a depth over device region 292 and another depth over field region 296 that is less than the depth over device region 292.

Similarly, contact electrode 242 may contact fin portion 212 of semiconductor pillar 210 in device region 292 and may include a portion disposed over field insulator 280 in field region 296, as shown. As discussed, contact electrode 242 may have a similar structure to that of gate electrode 220 such that contact electrode 242 may have a depth over device region 292 and another depth over field region 296 that is less than the depth over device region 292.

Further, the various height relationships (e.g. how unrecessed field insulator 280 is with respect to fin portion 212) described with respect to gate 220 in FIG. 3 also apply to applications of contact electrodes 230, 242 and will not be repeated for the sake of brevity. In general, contact electrodes 230, 242, 244, may include any suitable materials, such as for example, metals. For example, contact electrode 230 may include a source metal (i.e., a metal used for the source contact) and contact electrode 242 may include a drain metal (i.e., a metal used for a drain contact). In some examples, contact electrode 230 and contact electrode 242 may be the same material or materials. In other examples, contact electrode 230 and contact electrode 242 may be include different materials.

As discussed, semiconductor pillar 210 may form a portion of transistor 202. For example, fin portion 212, a part of fin portion 212, or fin portion 212 and some or all of base portion 214 of semiconductor pillar 210 may include a channel region, a source region, a drain region, and or other structures integral to transistor 202. For example, fin portion 212 may include a channel region 252 adjacent to (and, in FIG. 2, substantially under) gate electrode 220, a source region 254 and a drain region 256 on opposite sides of channel region 252. Source region 254 may be adjacent to (and, in FIG. 2, substantially under) source electrode 230 and drain region 256 may be adjacent to (and, in FIG. 2, substantially under) drain electrode 242, for example.

Also as discussed, conformal insulator layer 260 may be disposed between base portion 214 semiconductor pillar 210 and field insulator 280. For example, conformal insulator layer 260 may be in contact with base portion 214 of semiconductor pillar 210. In various examples, conformal insulator layer 260 may be an oxide. Further conformal insulator layer 270 may be disposed between base portion 214 of semiconductor pillar 210 and field insulator 280. For example, conformal insulator layer 270 may be in contact with conformal insulator layer 260 and field insulator 280. In various examples, conformal insulator layer 270 may be a nitride.

With structural features associated with embodiments of the present invention described, techniques for providing thinner electrodes over an unrecessed field insulator to decrease electrode coupling and to increase operating frequency of the ICs are now described. FIGS. 4A-4G are cross-sectional views of example transistors as particular fabrication operations are performed, arranged in accordance with at least some implementations of the present disclosure. Such techniques may be utilized to arrive at the structures of FIGS. 2 and 3, with FIG. 4G substantially matching FIG. 3. In general, the techniques described with respect to FIG. 4 may provide an example method for forming the structure of FIGS. 2 and 3; however, other methods may be available for forming the structures of FIGS. 2 and 3.

Figure 4A:
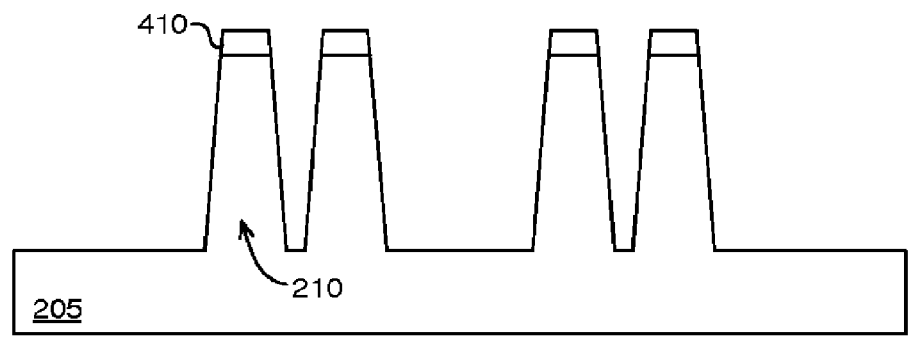
FIGS. 4A-4G are cross-sectional views of example transistors as particular fabrication operations are performed.

In the exemplary embodiment illustrated in FIG. 4A, a hardmask portion 410 may be disposed on semiconductor pillar 210 formed from substrate 205 after operation 502. As discussed, substrate 205 may include any suitable substrate such as, for example, silicon. In various examples, the hardmask and hardmask portion 410 may include a nitride hardmask. In other examples, a hard mask may not be used or the hardmask may be removed prior to further processing.

Figure 4B:
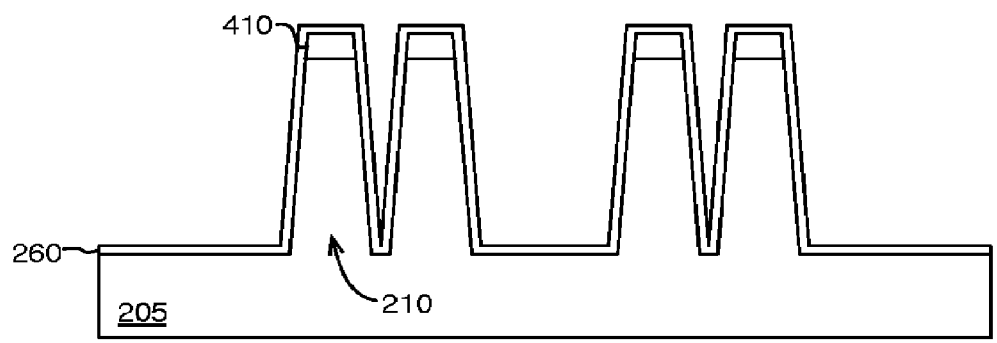

In the exemplary embodiment illustrated in FIG. 4B, conformal insulator layer 260 may be formed over substrate 205, semiconductor pillar 210, and hardmask portion 410. In general, although discussed with respect to an oxide, conformal insulator layer 260 may include any suitable insulator material or materials. Further, conformal insulator layer 260 may be formed or deposited using any known technique or techniques such as, for example, a chemical vapor deposition or the like.

Figure 4C:
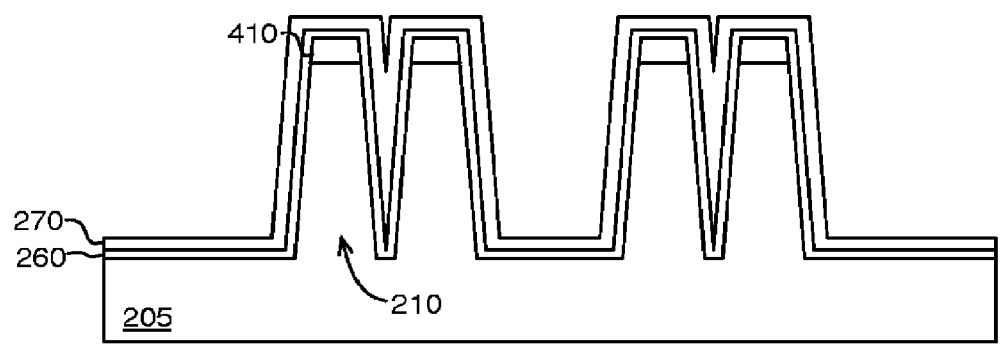

In the exemplary embodiment illustrated in FIG. 4C, conformal insulator layer 270 may be formed over conformal insulator layer 260, substrate 205, semiconductor pillar 210, and hardmask portion 410. In general, although discussed with respect to a nitride, conformal insulator layer 270 may include any suitable insulator material or materials. Further, conformal insulator layer 260 may be formed or deposited using any known technique or techniques such as, for example, a chemical vapor deposition or the like. Although the exemplary embodiment is discussed with respect to two conformal insulator layers, in some examples, a single conformal insulator layer may be used.

Figure 4D:
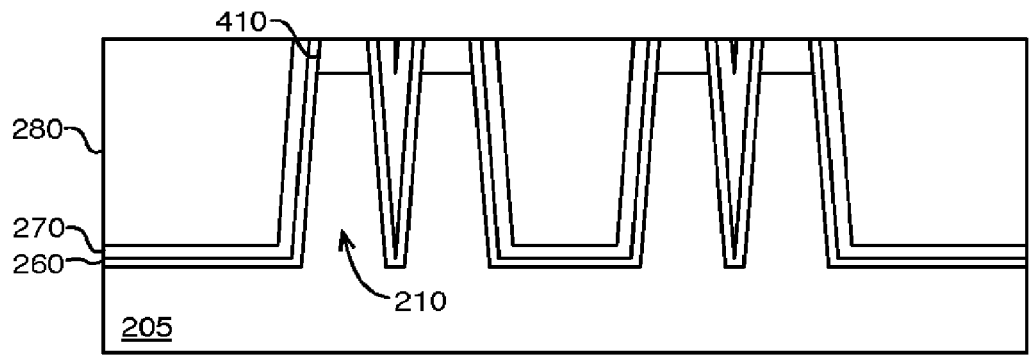

In the exemplary embodiment illustrated in FIG. 4D, field insulator 280 may be formed adjacent to conformal insulator layer 270. In general, although discussed with respect to a field oxide, field insulator 280 may include any suitable insulator material or materials. As discussed, in the exemplary embodiment, field insulator 280 may be formed by first depositing a bulk insulator or insulators, via any deposition technique, and polishing the deposited bulk insulator back to the hard mask portion 410. Such a polish process may also remove portions of the one or more conformal insulator layers, such as conformal insulator layer 260 and conformal insulator layer 270 to expose hard mask portion 410, as shown.

Figure 4E:
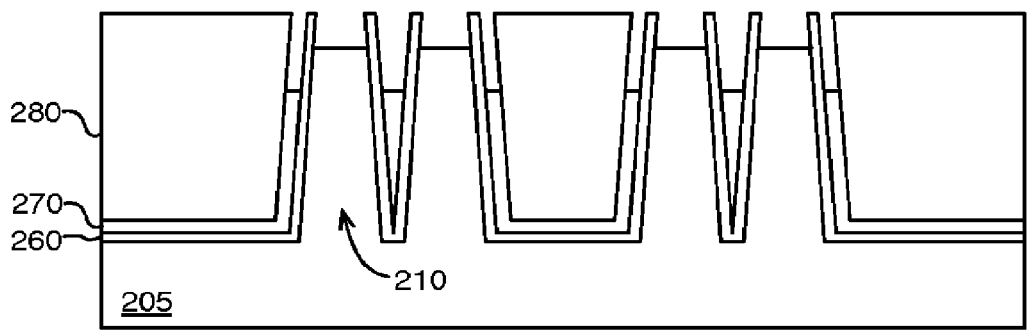

In some examples, such as the exemplary embodiment of FIG. 4E, a selective etch may remove portions of conformal insulator layer 270. Further, in some examples, the selective etch may remove hardmask portion 410 as shown, either fully or partially. For example, the selective nitride etch may be deep silicon nitride (e.g. SiN) etch, selective to oxides (e.g., SiO) and silicon (e.g., Si).

Figure 4F:
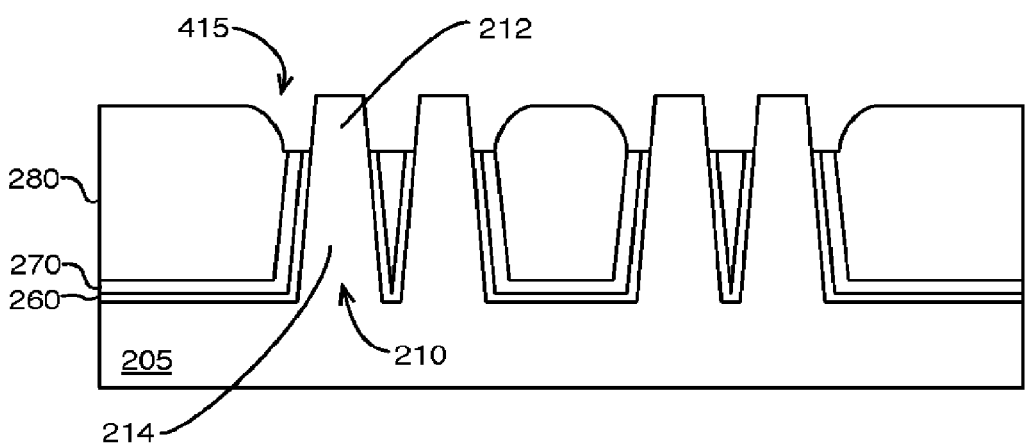
Figure 4G:
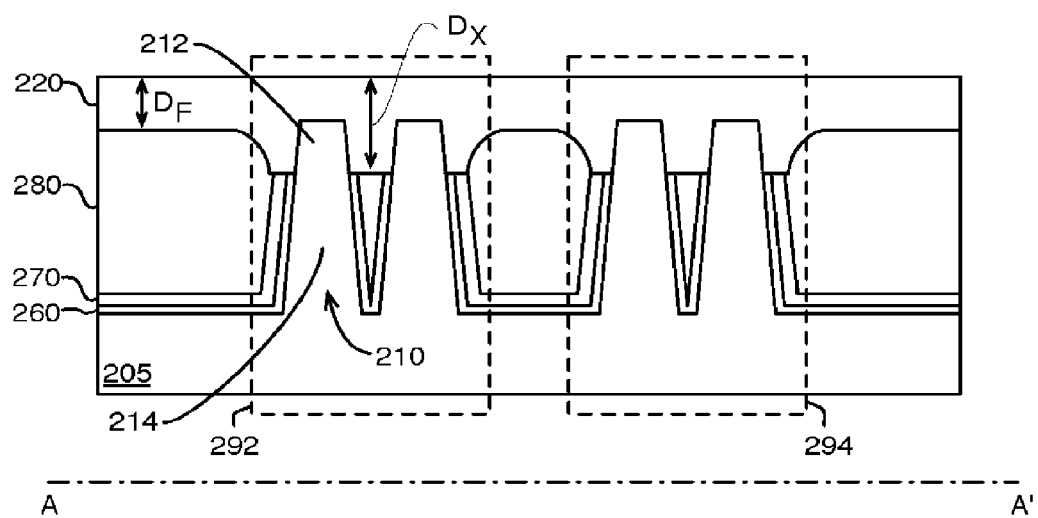

In some examples, such as the exemplary embodiment of FIG. 4F, a portion of conformal insulator layer 260 and a portion of field insulator 280 may be removed to expose a fin portion 212 of semiconductor pillar 210. For example, the selective oxide etch may be a relatively short oxide etch. As shown at edge 415, a portion of field insulator 280 may be removed or corroded. Such removal or corrosion may aid subsequent access to fin portion 212, for example.

In some examples, such as the exemplary embodiment of FIG. 2, gate electrode 220 and contact electrodes 230, 242, 242, or the like may be formed using known techniques. For example, damascene techniques, replacement gate techniques, contact trench patterning operations (e.g., to form trench-shaped contacts), or the like, as known by those of skill in the art, may be used to form gate electrode 220 and contact electrodes 230, 242, 242.

Additionally or alternatively, continuing to refer to FIG. 2, in some examples, one or more vias 250a-250d may be formed to contact gate electrode 220 and contact electrodes 230, 242, 242. Subsequently, higher level metallization layers and inter-level contacts may be formed to, in part, complete the integrated circuit. Further, a completed integrated circuit may be packaged and bonded to other device components or a motherboard or the like to, in part, form a product such as a consumer electronic product or the like. Such techniques are known by those of skill in the art and will not be repeated here.

Figure 5:
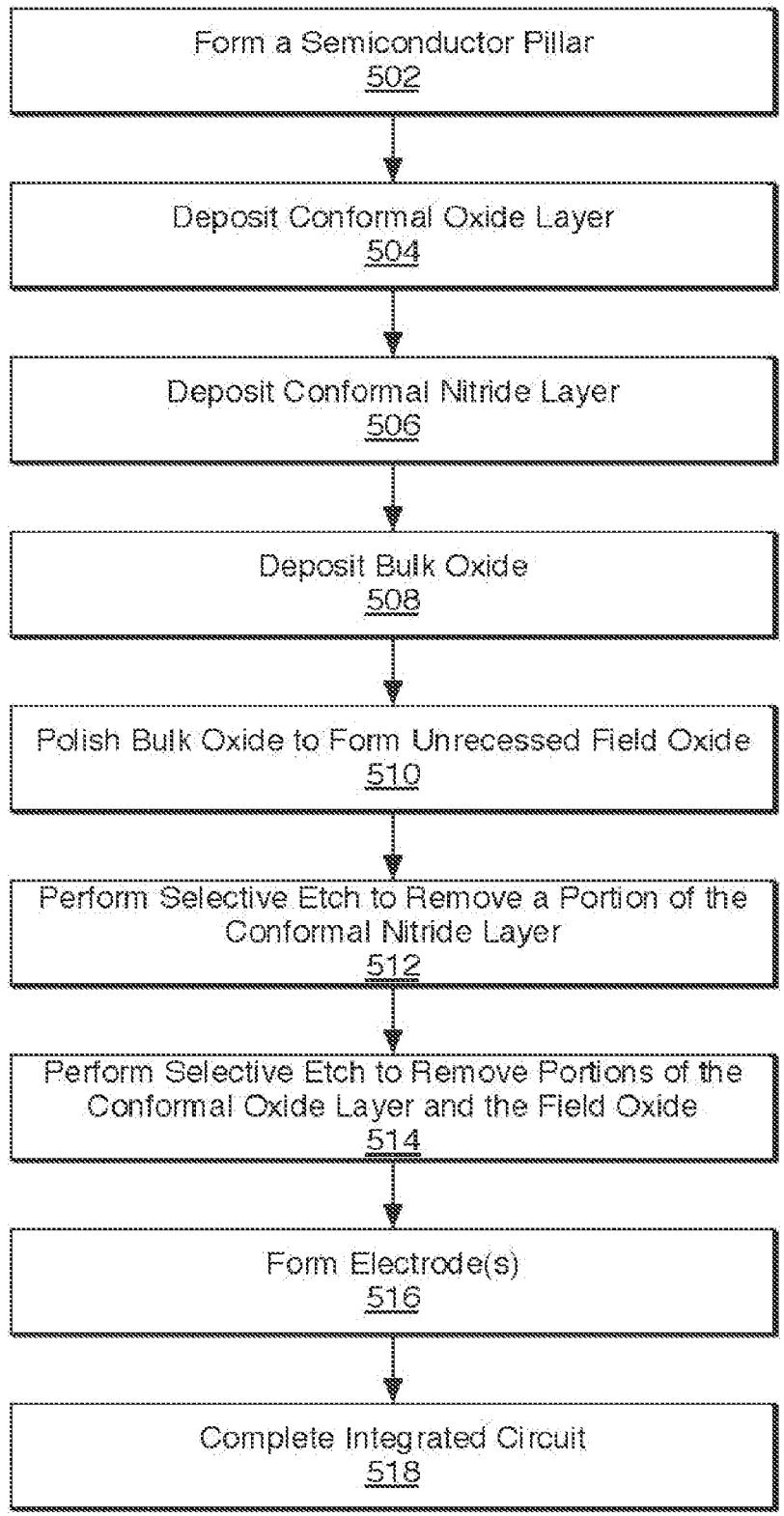
FIG. 5 is a flow diagram illustrating a process for forming an unrecessed field insulator and thinner electrodes over the field insulator.

FIG. 5 is a flow diagram illustrating a process 500 for forming an unrecessed field insulator and thinner electrodes over the field insulator, arranged in accordance with at least some implementations of the present disclosure. In the illustrated implementation, process 500 may include one or more operations, functions or actions as illustrated by one or more of operations 502, 504, 506, 508, 510, 512, 514, 516, and/or 518. However, embodiments herein may include any number of operations such that some may be skipped or the like. Further, various embodiments may include additional operations not shown for the sake of clarity. Also, in general, the techniques described with respect to FIG. 5 may provide an example method for forming the structure of FIGS. 2 and 3; however, other methods may be available for forming the structures of FIGS. 2 and 3.

Process 500 may begin at operation 502, "Form a Semiconductor Pillar", where a semiconductor pillar may be formed. While operation may be performed using any techniques known in the art and embodiments of the present invention are not limited in this respect, in the exemplary embodiment illustrated in FIG. 4A, operation 502 includes patterning a hardmask over a bulk substrate (of silicon, for example) and etching portion portions of the bulk substrate to form the semiconductor pillar or pillars. As shown in FIG. 4A, a hardmask portion 410 may be disposed on semiconductor pillar 210 formed from substrate 205 after operation 502. As discussed, substrate 205 may include any suitable substrate such as, for example, silicon. In various examples, the hardmask and hardmask portion 410 may include a nitride hardmask. In other examples, a hard mask may not be used or the hardmask may be removed prior to further processing.

Process 500 may continue from operation 502 to operation 504, "Deposit Conformal Oxide layer", where a conformal insulator layer, such as, for example, an oxide, may be formed over the semiconductor pillar and the hardmask portion. For example, in the exemplary embodiment illustrated in FIG. 4B, conformal insulator layer 260 may be formed over substrate 205, semiconductor pillar 210, and hardmask portion 410. In general, although discussed with respect to an oxide, conformal insulator layer 260 may include any suitable insulator material or materials. Further, conformal insulator layer 260 may be formed or deposited using any known technique or techniques such as, for example, a chemical vapor deposition or the like.

Process 500 may continue from operation 504 to operation 506, "Deposit Conformal Nitride Layer", where a conformal insulator layer, such as, for example, a nitride, may be formed adjacent to a semiconductor pillar disposed on a substrate. For example, in the exemplary embodiment illustrated in FIG. 4C, conformal insulator layer 270 may be formed over conformal insulator layer 260, substrate 205, semiconductor pillar 210, and hardmask portion 410. In general, although discussed with respect to a nitride, conformal insulator layer 270 may include any suitable insulator material or materials. Further, conformal insulator layer 260 may be formed or deposited using any known technique or techniques such as, for example, a chemical vapor deposition or the like. Although the exemplary embodiment is discussed with respect to two conformal insulator layers, in some examples, a single conformal insulator layer may be used.

Process 500 may continue from operation 506 to operation 508, "Deposit Bulk Oxide", and operation 510, "Polish Bulk Oxide to Form Unrecessed Field Oxide", where a field insulator, such as, for example, a field oxide, may be formed adjacent to the one or more conformal insulator layers. For example, in the exemplary embodiment illustrated in FIG. 4D, field insulator 280 may be formed adjacent to conformal insulator layer 270. In general, although discussed with respect to a field oxide, field insulator 280 may include any suitable insulator material or materials. As discussed, in the exemplary embodiment, field insulator 280 may be formed by first depositing a bulk insulator or insulators, via any deposition technique, and polishing the deposited bulk insulator back to the hard mask portion 410. Such a polish process may also remove portions of the one or more conformal insulator layers, such as conformal insulator layer 260 and conformal insulator layer 270 to expose hard mask portion 410, as shown.

Process 500 may continue from operation 510 to operation 512, "Perform Selective Etch to Remove a Portion of the Conformal Nitride Layer", where a selective nitride etch may be performed to remove at least a portion of a conformal insulator layer such as, for example, a conformal nitride layer. In examples where a single conformal insulator is used, the selective etch may expose a fin portion of the semiconductor pillar. In other examples, such as the exemplary embodiment of FIG. 4E, the selective etch may remove portions of conformal insulator layer 270. Further, in some examples, the selective etch may remove hardmask portion 410 as shown, either fully or partially. For example, the selective nitride etch may be deep silicon nitride (e.g. SiN) etch, selective to oxides (e.g., SiO) and silicon (e.g., Si).

Process 500 may continue from operation 512 to operation 514, "Perform Selective Etch to Remove Portions of the Conformal Oxide Layer and the Field Oxide", where a selective etch may be performed to remove a portion of a conformal insulator such as, for example, a conformal oxide layer, and portions of a field oxide. In some examples, such as the exemplary embodiment of FIG. 4F, a portion of conformal insulator layer 260 and a portion of field insulator 280 may be removed to expose a fin portion 212 of semiconductor pillar 210. For example, the selective oxide etch may be a relatively short oxide etch. As shown at edge 415, a portion of field insulator 280 may be removed or corroded. Such removal or corrosion may aid subsequent access to fin portion 212, for example.

Process 500 may continue from operation 514 to operation 516, "Form Electrode(s)", where electrodes may be formed. For example, as shown in FIG. 2, gate electrode 220 and contact electrodes 230, 242, 242, or the like may be formed using known techniques. For example, damascene techniques, replacement gate techniques, contact trench patterning operations (e.g., to form trench-shaped contacts), or the like, as known by those of skill in the art, may be used to form gate electrode 220 and contact electrodes 230, 242, 242.

Process 500 may continue from operation 516 to operation 518, "Complete Integrated Circuit", where an integrated circuit as discussed herein may be completed. For example, as shown in FIG. 2, one or more vias 250a-250d may be formed to contact gate electrode 220 and contact electrodes 230, 242, 242. Subsequently, higher level metallization layers and inter-level contacts may be formed to, in part, complete the integrated circuit. Further, a completed integrated circuit may be packaged and bonded to other device components or a motherboard or the like to, in part, form a product such as a consumer electronic product or the like. Such techniques are known by those of skill in the art and will not be repeated here.

While implementation of example process 500, may include the undertaking of all blocks shown in the order illustrated, the present disclosure is not limited in this regard and, in various examples, implementation of processes 500 may include the undertaking only a subset of the blocks shown and/or in a different order than illustrated.

In addition, any one or more of the blocks of FIG. 5 may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the blocks shown in FIG. 5 in response to instructions conveyed to the processor by a computer readable medium.

Figure 6:
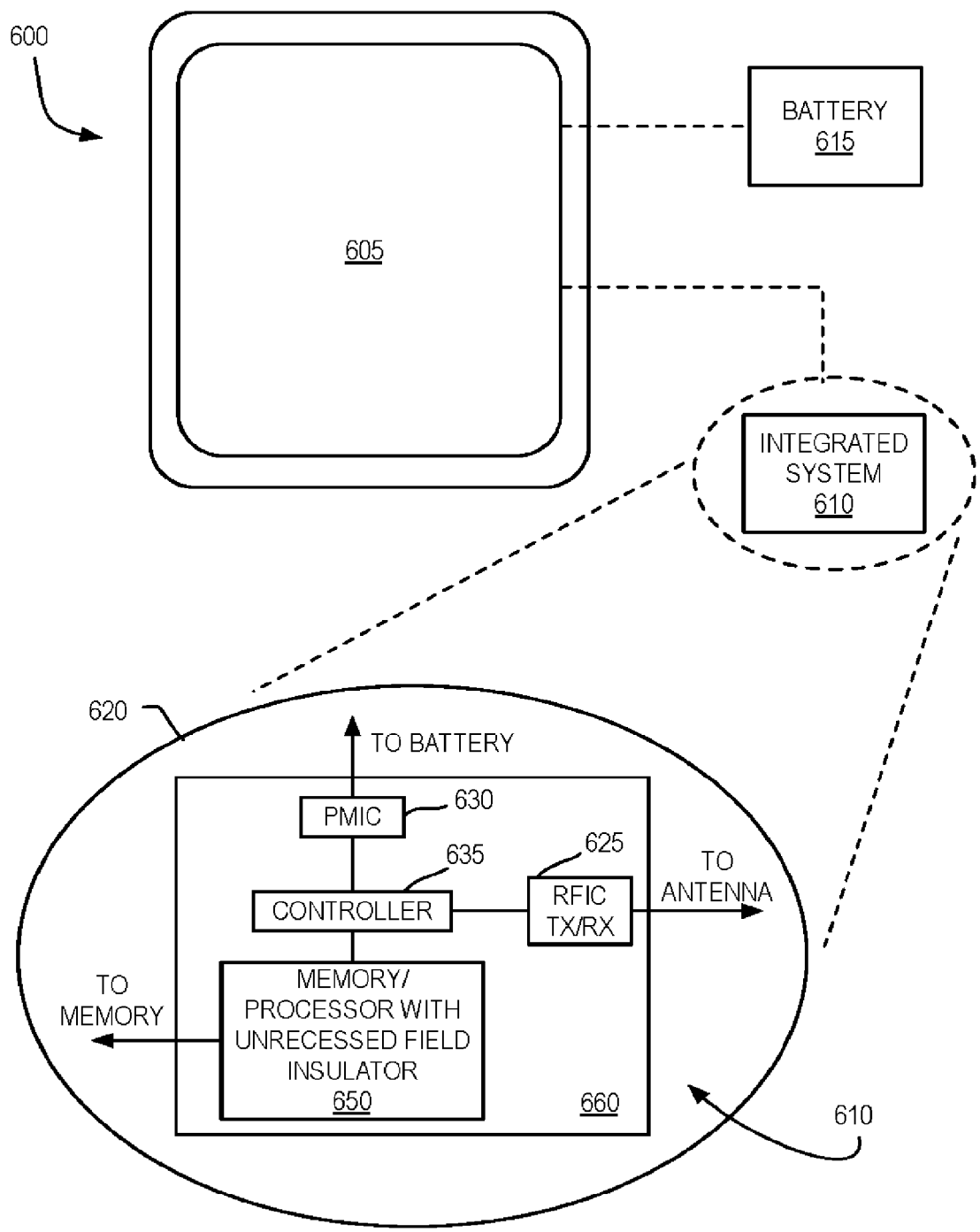
FIG. 6 is an illustrative diagram of a mobile computing platform employing an IC with transistors having an unrecessed field insulator and thinner electrodes over the field insulator.

FIG. 6 is an illustrative diagram of a mobile computing platform employing an IC with transistors having an unrecessed field insulator and thinner electrodes over the field insulator, arranged in accordance with at least some implementations of the present disclosure. Mobile computing platform 600 may be any portable device configured for each of electronic data display, electronic data processing, wireless electronic data transmission, or the like. For example, mobile computing platform 600 may be any of a tablet, a smart phone, laptop computer, etc. and may include a display screen 605, which in the exemplary embodiment is a touchscreen (e.g., capacitive, inductive, resistive, etc. touchscreen), a chip-level (SoC) or package-level integrated system 610, and a battery 615.

Integrated system 610 is further illustrated in the expanded view 620. In the exemplary embodiment, packaged device 650 (labeled "Memory/Processor with Unrecessed Field Insulator" in FIG. 6) includes at least one memory chip (e.g., RAM), and/or at least one processor chip (e.g., a microprocessor, a multi-core microprocessor, or graphics processor, or the like) employing transistors with an unrecessed field insulator and thinner electrodes over the field insulator as discussed herein. In an embodiment, the package device 650 is a microprocessor including an SRAM cache memory employing transistors with an unrecessed field insulator and thinner electrodes over the field insulator as discussed herein (for example, the SRAM cache memory may include an inverter circuit employing transistors as discussed herein). An employed transistor may include a semiconductor pillar disposed over a device region of a substrate, the semiconductor pillar having a base portion and a fin portion, a field insulator disposed over a field region of the substrate and adjacent to the base portion of the semiconductor pillar, and a gate electrode coupled to the fin portion of the semiconductor pillar in the device region and disposed over the field insulator in the field region, wherein the gate electrode has a first depth over the device region and a second depth less than the first depth over the field region, as discussed herein. Packaged device 650 may be further coupled to (e.g., communicatively coupled to) a board, a substrate, or an interposer 660 along with, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path), and a controller thereof 635. In general, packaged device 650 may be also be coupled to (e.g., communicatively coupled to) display screen 605

Functionally, PMIC 630 may perform battery power regulation, DC-to-DC conversion, etc., and so has an input coupled to battery 615 and with an output providing a current supply to other functional modules. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 650 or within a single IC (SoC) coupled to the package substrate of the packaged device 650.

Figure 7:
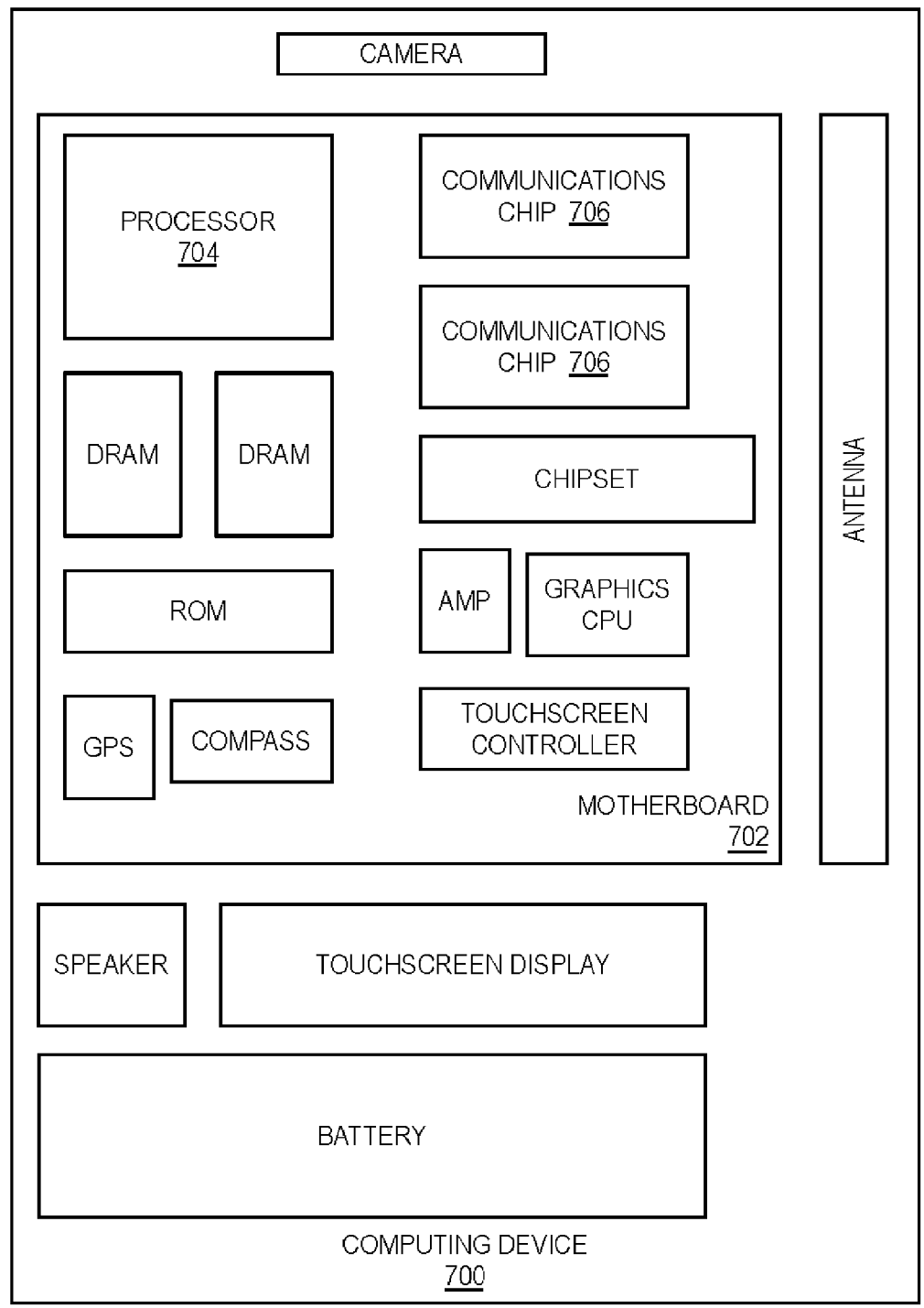
FIG. 7 is a functional block diagram of a computing device, all arranged in accordance with at least some implementations of the present disclosure.

FIG. 7 is a functional block diagram of a computing device 700, arranged in accordance with at least some implementations of the present disclosure. Computing device 700 may be found inside platform 600, for example, and further includes a motherboard 702 hosting a number of components, such as but not limited to a processor 704 (e.g., an applications processor), which may incorporate transistors having an unrecessed field insulator and thinner electrodes over the field insulator as discussed herein, and at least one communication chip 1006. In embodiments, at least one of the processor 1004 one or more communication chips 706, or the like. Processor 704 may be physically and/or electrically coupled to motherboard 702. In some examples, processor 704 includes an integrated circuit die packaged within the processor 704. In general, the term "processor" may refer to any device or portion of a device that processes electronic data from registers and/or memory to transform that electronic data into other electronic data that may be stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 706 may enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one example, an integrated circuit device may include a semiconductor pillar disposed over a device region of a substrate such that the semiconductor pillar may have a base portion and a fin portion, a field insulator disposed over a field region of the substrate and adjacent to the base portion of the semiconductor pillar, and a gate electrode coupled to the fin portion of the semiconductor pillar in the device region and disposed over the field insulator in the field region such that the gate electrode may have a first depth over the device region and a second depth less than the first depth over the field region.

In a further example of an integrated circuit device, the integrated circuit device may include a first conformal insulator layer between the base portion of the semiconductor pillar and the field insulator such that the first conformal insulator layer may be in contact with the base portion of the semiconductor pillar, and such that the first conformal insulator layer may be an oxide, a second conformal insulator layer between the base portion of the semiconductor pillar and the field insulator such that the second conformal insulator layer may be in contact with the first conformal insulator layer and the field insulator, and such that the second conformal insulator layer may be a nitride, a gate dielectric disposed between the gate electrode and the fin portion of the semiconductor pillar such that the gate electrode may include a bulk material and a work function material disposed between the bulk material and the gate dielectric, a first contact electrode coupled to the fin portion of the semiconductor pillar in the device region and disposed over the field insulator in the field region such that the first contact electrode may be a source electrode, such that the source electrode has a third depth over the device region and a fourth depth less than the third depth over the field region, and such that the source electrode may include a source contact metal, and a second contact electrode coupled to the fin portion of the semiconductor pillar in the device region and disposed over the field insulator in the field region such that the second contact electrode comprises a drain electrode, such that the drain electrode has a fifth depth over the device region and a sixth depth less than the fifth depth over the field region, and such that the drain electrode may include a drain contact metal. The fin portion of the semiconductor pillar may include a channel region adjacent to the gate electrode, and a source region and a drain region on opposite sides of the channel region such that the source region is adjacent to the source electrode, and such that the drain region is adjacent to the drain electrode. The field insulator may have a top surface at a first height above a surface of the substrate and the fin portion of the semiconductor pillar may have a bottom surface at a second height above the surface of the substrate and a top surface at a third height above the surface of the substrate. The first height may be at least one of substantially equal to the third height, greater than a midpoint between the second height and the third height, or greater than a height 30% from the second height to the third height.

In another example, a method of fabricating an integrated circuit may include forming a conformal insulator layer adjacent to a semiconductor pillar disposed on a substrate, forming a field insulator adjacent to the conformal insulator layer, performing a first selective etch to remove at least a portion of the conformal insulator layer to expose a fin portion of the semiconductor pillar, performing a second selective etch to remove at least a portion of the field insulator adjacent to the fin portion of the semiconductor pillar, and forming a gate electrode coupled to the fin portion of the semiconductor pillar and disposed over the field insulator such that the gate electrode has a first depth over the conformal insulator layer and a second depth less than the first depth over the field insulator.

In a further example of a method of fabricating an integrated circuit, the method may include forming the semiconductor pillar by patterning a hardmask over a bulk substrate and etching a portion of the bulk substrate to form the semiconductor pillar such that a portion of the hardmask may be disposed on the semiconductor pillar and forming, prior to forming the conformal insulator layer, a second conformal insulator layer over the semiconductor pillar such that the second conformal insulator layer includes an oxide, such that forming the conformal insulator layer includes forming the conformal insulator layer over the second conformal insulator layer, and such that the conformal insulator layer includes a nitride. Forming the field insulator adjacent to the conformal insulator may include depositing a bulk field insulator and polishing the bulk field insulator to form the field insulator and to expose the portion of the hardmask, a portion of the conformal insulator layer, and a portion of the second conformal insulator layer. The field insulator may include an oxide. Performing the first selective etch may remove the portion of hardmask over the semiconductor pillar. Performing the second selective etch may remove at least a portion of the second conformal insulator layer adjacent to the fin portion of the semiconductor pillar. The field insulator may have a top surface at a first height above a surface of the substrate. The fin portion of the semiconductor pillar may have a bottom surface at a second height above the surface of the substrate and a top surface at a third height above the surface of the substrate. The first height may be at least one of substantially equal to the third height, greater than a midpoint between the second height and the third height, or greater than a height 30% from the second height to the third height.

In a further example, a microprocessor may include an SRAM cache memory further having a transistor including any one of the above example structures.

In a still further example, a mobile computing platform may include any of the example structures.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed:

1. An integrated circuit device comprising:
   a semiconductor pillar disposed over a device region of a substrate, the semiconductor pillar having a base portion and a fin portion;
   a field insulator disposed over a field region of the substrate and adjacent to the base portion of the semiconductor pillar;
   a gate electrode coupled to the fin portion of the semiconductor pillar in the device region and disposed over the field insulator in the field region, wherein the gate electrode has a first depth over the device region and a second depth less than the first depth over the field region;
   a source electrode coupled to the fin portion of the semiconductor pillar in the device region and disposed over the field insulator in the field region, wherein the source electrode has a third depth over the device region and a fourth depth less than the third depth over the field region; and
   a drain electrode coupled to the fin portion of the semiconductor pillar in the device region and disposed over the field insulator in the field region, wherein the drain electrode has a fifth depth over the device region and a sixth depth less than the fifth depth over the field region,
   wherein the fin portion of the semiconductor pillar comprises a channel region adjacent to the gate electrode, and a source region and a drain region on opposite sides of the channel region, wherein the source region is adjacent to the source electrode, and wherein the drain region is adjacent to the drain electrode.

2. The integrated circuit device of claim 1, wherein field insulator has a top surface at a first height above a surface of the substrate, wherein the fin portion of the semiconductor pillar has a bottom surface at a second height above the surface of the substrate and a top surface at a third height above the surface of the substrate, and the first height is between the second height and the third height.

3. The integrated circuit device of claim 1, further comprising:
   a conformal oxide insulator layer between the base portion of the semiconductor pillar and the field insulator and in contact with the base portion of the semiconductor pillar; and
   a conformal nitride insulator layer between the base portion of the semiconductor pillar and the field insulator and in contact with the first conformal insulator layer and the field insulator.

4. The integrated circuit device of claim 1, further comprising:
   a first conformal insulator layer between the base portion of the semiconductor pillar and the field insulator, wherein the first conformal insulator layer is in contact with the base portion of the semiconductor pillar;
   a second conformal insulator layer between the base portion of the semiconductor pillar and the field insulator, wherein the second conformal insulator layer is in contact with the first conformal insulator layer and the field insulator; and
   a gate dielectric disposed between the gate electrode and the fin portion of the semiconductor pillar, wherein the gate electrode comprises a bulk material and a work function material disposed between the bulk material and the gate dielectric.

5. A microprocessor comprising:
   an SRAM cache memory further comprising a transistor including:
   a semiconductor pillar disposed over a device region of a substrate, the semiconductor pillar having a base portion and a fin portion;
   a field insulator disposed over a field region of the substrate and adjacent to the base portion of the semiconductor pillar;
   a gate electrode coupled to the fin portion of the semiconductor pillar in the device region and disposed over the field insulator in the field region, wherein the gate electrode has a first depth over the device region and a second depth less than the first depth over the field region;
   a source electrode coupled to the fin portion of the semiconductor pillar in the device region and disposed over the field insulator in the field region, wherein the source electrode has a third depth over the device region and a fourth depth less than the third depth over the field region; and
   a drain electrode coupled to the fin portion of the semiconductor pillar in the device region and disposed over the field insulator in the field region, wherein the drain electrode has a fifth depth over the device region and a sixth depth less than the fifth depth over the field region,
   wherein the fin portion of the semiconductor pillar comprises a channel region adjacent to the gate electrode, and a source region and a drain region on opposite sides of the channel region, wherein the source region is adjacent to the source electrode, and wherein the drain region is adjacent to the drain electrode.

6. The microprocessor of claim 5, wherein the field insulator has a top surface at a first height above a surface of the substrate, wherein the fin portion of the semiconductor pillar has a bottom surface at a second height above the surface of the substrate and a top surface at a third height above the surface of the substrate, and the first height is between the second height and the third height.

7. The microprocessor of claim 5, further comprising:
a first conformal insulator layer between the base portion of the semiconductor pillar and the field insulator, wherein the first conformal insulator layer is in contact with the base portion of the semiconductor pillar;
a second conformal insulator layer between the base portion of the semiconductor pillar and the field insulator, wherein the second conformal insulator layer is in contact with the first conformal insulator layer and the field insulator; and
a gate dielectric disposed between the gate electrode and the fin portion of the semiconductor pillar, wherein the gate electrode comprises a bulk material and a work function material disposed between the bulk material and the gate dielectric.

8. A mobile computing platform comprising:
a microprocessor comprising:
a semiconductor pillar disposed over a device region of a substrate, the semiconductor pillar having a base portion and a fin portion,
a field insulator disposed over a field region of the substrate and adjacent to the base portion of the semiconductor pillar;
a gate electrode coupled to the fin portion of the semiconductor pillar in the device region and disposed over the field insulator in the field region, wherein the gate electrode has a first depth over the device region and a second depth less than the first depth over the field region;
a source electrode coupled to the fin portion of the semiconductor pillar in the device region and disposed over the field insulator in the field region, wherein the source electrode has a third depth over the device region and a fourth depth less than the third depth over the field region;
a drain electrode coupled to the fin portion of the semiconductor pillar in the device region and disposed over the field insulator in the field region, wherein the drain electrode has a fifth depth over the device region and a sixth depth less than the fifth depth over the field region,
wherein the fin portion of the semiconductor pillar comprises a channel region adjacent to the gate electrode, and a source region and a drain region on opposite sides of the channel region, wherein the source region is adjacent to the source electrode, and wherein the drain region is adjacent to the drain electrode;
a display screen communicatively coupled to the microprocessor; and
a wireless transceiver communicatively coupled to the microprocessor.

9. The mobile computing platform of claim 8, wherein the field insulator has a top surface at a first height above a surface of the substrate, wherein the fin portion of the semiconductor pillar has a bottom surface at a second height above the surface of the substrate and a top surface at a third height above the surface of the substrate, and the first height is between the second height and the third height.

10. The mobile computing platform of claim 8, further comprising:
a first conformal insulator layer between the base portion of the semiconductor pillar and the field insulator, wherein the first conformal insulator layer is in contact with the base portion of the semiconductor pillar;
a second conformal insulator layer between the base portion of the semiconductor pillar and the field insulator, wherein the second conformal insulator layer is in contact with the first conformal insulator layer and the field insulator; and
a gate dielectric disposed between the gate electrode and the fin portion of the semiconductor pillar, wherein the gate electrode comprises a bulk material and a work function material disposed between the bulk material and the gate dielectric.

11. A method of fabricating an integrated circuit, the method comprising:
forming a conformal insulator layer adjacent to a semiconductor pillar disposed on a substrate;
forming a field insulator adjacent to the conformal insulator layer;
performing a first selective etch to remove at least a portion of the conformal insulator layer to expose a fin portion of the semiconductor pillar;
performing a second selective etch to remove at least a portion of the field insulator adjacent to the fin portion of the semiconductor pillar; and
forming a gate electrode coupled to the fin portion of the semiconductor pillar and disposed over the field insulator, wherein the gate electrode has a first depth over the conformal insulator layer and a second depth less than the first depth over the field insulator.

12. The method of claim 11, wherein the field insulator has a top surface at a first height above a surface of the substrate, wherein the fin portion of the semiconductor pillar has a top surface at a second height above the surface of the substrate, and wherein the first height is substantially equal to the second height.

13. The method of claim 11, wherein the field insulator has a top surface at a first height above a surface of the substrate, wherein the fin portion of the semiconductor pillar has a bottom surface at a second height above the surface of the substrate and a top surface at a third height above the surface of the substrate, and wherein the first height is greater than a height 30% from the second height to the third height.

14. The method of claim 11, further comprising:
forming, prior to forming the conformal insulator layer, a second conformal insulator layer over the semiconductor pillar, wherein performing the second selective etch removes at least a portion of the second conformal insulator layer adjacent to the fin portion of the semiconductor pillar.

15. The method of claim 11, further comprising:
forming, prior to forming the conformal insulator layer, a second conformal insulator layer over the semiconductor pillar, wherein the second conformal insulator layer comprises an oxide, wherein forming the conformal insulator layer comprises forming the conformal insulator layer over the second conformal insulator layer, wherein the conformal insulator layer comprises a nitride, and wherein performing the second selective etch removes at least a portion of the second conformal insulator layer adjacent to the fin portion of the semiconductor pillar.

16. The method of claim 11, further comprising:
forming the semiconductor pillar by patterning a hardmask over a bulk substrate and etching a portion of the bulk substrate to form the semiconductor pillar, wherein a portion of the hardmask is disposed on the semiconductor pillar, and wherein performing the first selective etch removes the portion of hardmask over the semiconductor pillar.

17. The method of claim 11, further comprising:

forming the semiconductor pillar by patterning a hardmask over a bulk substrate and etching a portion of the bulk substrate to form the semiconductor pillar, wherein a portion of the hardmask is disposed on the semiconductor pillar; and forming, prior to forming the conformal insulator layer, a second conformal insulator layer over the semiconductor pillar, wherein forming the conformal insulator layer comprises forming the conformal insulator layer over the second conformal insulator layer, wherein forming the field insulator adjacent to the conformal insulator comprises depositing a bulk field insulator and polishing the bulk field insulator to form the field insulator and to expose the portion of the hardmask, a portion of the conformal insulator layer, and a portion of the second conformal insulator layer, wherein performing the first selective etch removes the portion of hardmask over the semiconductor pillar, and wherein performing the second selective etch removes at least a portion of the second conformal insulator layer adjacent to the fin portion of the semiconductor pillar.

18. The method of claim 11, further comprising:

forming the semiconductor pillar by patterning a hardmask over a bulk substrate and etching a portion of the bulk substrate to form the semiconductor pillar, wherein a portion of the hardmask is disposed on the semiconductor pillar; and forming, prior to forming the conformal insulator layer, a second conformal insulator layer over the semiconductor pillar, wherein the second conformal insulator layer comprises an oxide, wherein forming the conformal insulator layer comprises forming the conformal insulator layer over the second conformal insulator layer, and wherein the conformal insulator layer comprises a nitride;

wherein forming the field insulator adjacent to the conformal insulator comprises depositing a bulk field insulator and polishing the bulk field insulator to form the field insulator and to expose the portion of the hardmask, a portion of the conformal insulator layer, and a portion of the second conformal insulator layer, and wherein the field insulator comprises an oxide, wherein performing the first selective etch removes the portion of hardmask over the semiconductor pillar, wherein performing the second selective etch removes at least a portion of the second conformal insulator layer adjacent to the fin portion of the semiconductor pillar, and wherein the field insulator has a top surface at a first height above a surface of the substrate, wherein the fin portion of the semiconductor pillar has a bottom surface at a second height above the surface of the substrate and a top surface at a third height above the surface of the substrate, and wherein the first height is at least one of substantially equal to the third height, greater than a midpoint between the second height and the third height, or greater than a height 30% from the second height to the third height.

* * * * *